United States Patent
Lee et al.

(10) Patent No.: US 12,249,369 B2
(45) Date of Patent: Mar. 11, 2025

(54) ADJUSTING OPERATION VOLTAGE OF CROSS POINT MEMORY ACCORDING TO AGING INFORMATION

(71) Applicant: Taiwan Semiconductor Manufacturing Company, Ltd., Hsinchu (TW)

(72) Inventors: Hengyuan Lee, Hsinchu County (TW); Cheng-Hsien Wu, Hsinchu (TW); Yu-Sheng Chen, Taoyuan (TW); Chien-Min Lee, Hsinchu County (TW); Xinyu Bao, Fremont, CA (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 129 days.

(21) Appl. No.: 17/666,553

(22) Filed: Feb. 8, 2022

(65) Prior Publication Data

US 2023/0008947 A1 Jan. 12, 2023

Related U.S. Application Data

(60) Provisional application No. 63/219,838, filed on Jul. 9, 2021.

(51) Int. Cl.
*G11C 13/00* (2006.01)
*H10B 63/00* (2023.01)

(52) U.S. Cl.
CPC ........ *G11C 13/003* (2013.01); *G11C 13/0004* (2013.01); *G11C 13/0035* (2013.01); *G11C 13/004* (2013.01); *G11C 13/0033* (2013.01); *G11C 13/0069* (2013.01); *G11C 2213/15* (2013.01); *G11C 2213/72* (2013.01); *H10B 63/20* (2023.02); *H10B 63/80* (2023.02)

(58) Field of Classification Search
CPC .............. G11C 13/003; G11C 13/0004; G11C 13/0035; G11C 13/004; G11C 13/0069; G11C 2213/15
See application file for complete search history.

(56) References Cited

U.S. PATENT DOCUMENTS

| | | | | |
|---|---|---|---|---|
| 11,636,895 | B2 * | 4/2023 | Lim | G11C 13/003 365/163 |
| 2010/0149856 | A1 * | 6/2010 | Tang | G11C 13/0069 365/207 |
| 2010/0163818 | A1 * | 7/2010 | Lee | H10N 70/066 438/102 |
| 2016/0133319 | A1 * | 5/2016 | Fantini | G11C 13/0004 365/163 |
| 2019/0066778 | A1 * | 2/2019 | Lin | G11C 13/0004 |
| 2020/0052036 | A1 * | 2/2020 | Ikarashi | H10N 70/231 |
| 2020/0105354 | A1 * | 4/2020 | Helmick | G11C 16/3495 |
| 2022/0123209 | A1 * | 4/2022 | Cheng | H10B 63/84 |
| 2022/0139454 | A1 * | 5/2022 | Robertson | G11C 13/004 365/148 |

* cited by examiner

*Primary Examiner* — Mushfique Siddique
(74) *Attorney, Agent, or Firm* — JCIPRNET

(57) ABSTRACT

A control method to operate a memory device, a control method to operate a memory system and a control system are provided. The control method includes providing a first voltage to a memory device for accessing a memory element of the memory device; obtaining an aging information of the memory device; and providing a second voltage to the memory device according to the aging information, wherein the first voltage and the second voltage are reverse biased voltages.

20 Claims, 9 Drawing Sheets

ADJUSTING OPERATION VOLTAGE OF CROSS POINT MEMORY ACCORDING TO AGING INFORMATION

CROSS-REFERENCE TO RELATED APPLICATION(S)

This application claims priority to U.S. Provisional Application No. 63/219,838 entitled "MEMORY SYSTEM AND CONTROL METHOD" filed on Jul. 9, 2021, of which the entire disclosure is hereby incorporated by reference in its entirety.

BACKGROUND

With advances in digital technology, there is a greater demand for a nonvolatile memory device with higher capacity, less writing power, higher writing/reading speed, and longer service life. In order to meet the demand, refinement of a flash memory has been progressed. On the other hand, a nonvolatile memory device including memory cells each having a resistance variable element has been researched and developed.

Mostly, each of these nonvolatile memories has field effect transistors (FETs) that connect and disconnect the resistance variable elements from a driving circuit. The FETs have high on/off ratio and prevent leakage current from passing through the unselected memory cells. However, since a FET is a three-terminal device, controlling access of the resistance variable elements by the FETs can significantly limit design flexibility and integration level in creating these nonvolatile memories.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
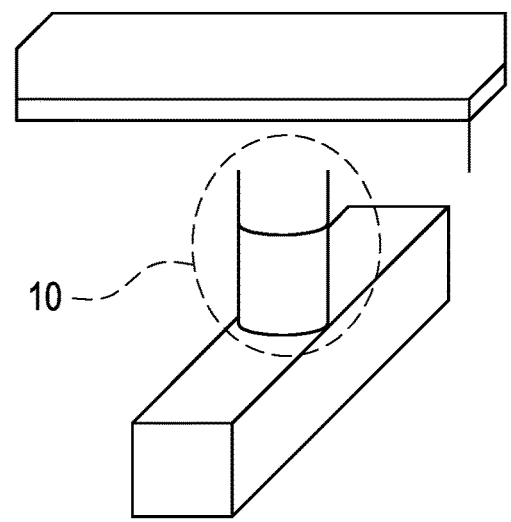
FIG. 1A illustrates a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A illustrates a memory device 10 according to some embodiments of the present disclosure. The memory device 10 has two terminals, respectively coupled to a word line WL and a bit line BL. In some embodiments, the memory device 10 is also referred as a cross point memory device 10. The word line WL and the bit line BL are respectively coupled to the two terminals according the memory device 10. The memory device 10 may be accessed according to a voltage difference between the word line WL and the bit line BL. For example, a read operation or a write operation may be performed to the memory device 10 according to the voltage difference of the two terminals across the memory device 10.

Figure 1B:
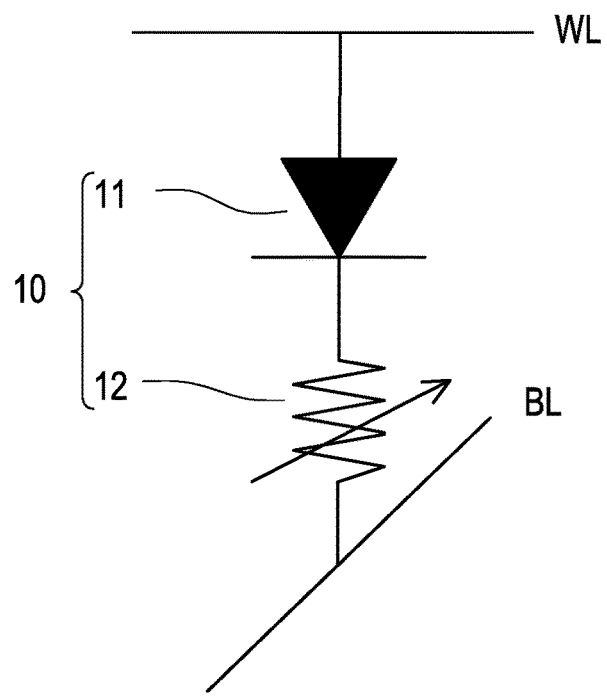
FIG. 1B illustrates a schematic of an equivalent circuit of the memory device as illustrated in FIG. 1A according to some embodiments of the present disclosure.

FIG. 1B illustrates a schematic of an equivalent circuit of the memory device 10 as illustrated in FIG. 1A according to some embodiments of the present disclosure. The two terminals of the memory device 10 are respectively coupled to the word line WL and the bit line BL. The memory device 10 includes a selector 11 and a memory element 12. The selector 11 and the memory element 12 are serially coupled between the word line WL and the bit line BL. The selector 11 is coupled to the word line WL. The memory element 12 is coupled to the bit line BL.

In some embodiments, when a read operation or a write operation is performed to the memory device 10, the selector 11 may be functioned as a diode. The memory element 12 may be function as a for example, but not limited to, variable resistance. An anode of the diode in the equivalent circuit may be connected to the word line WL, and a cathode of the diode in the equivalent circuit may be connected to the variable resistance. The variable resistance in the equivalent circuit is coupled between the cathode of the diode and the bit line BL.

In some embodiments, the selector 11 may be turned on or conducted when the voltage difference between the word line WL and the bit line BL is greater than a predetermined voltage threshold. In some embodiments, the predetermined voltage threshold is a positive voltage. Therefore, the voltage difference between the word line WL and the bit line BL may be a positive voltage, and the voltage difference may be greater than the predetermined voltage threshold, so the selector 11 may be turned on by the applied voltage difference.

When the selector 11 is turned on, the data stored by the memory element 12 is accessible. When the selector is cutoff or unconducted, the data stored by the memory element 12 is inaccessible. Therefore, when the selector 11 is turned on, a read operation or a write operation may be performed to the memory element 12 for accessing the data stored thereby. In some embodiments, when the write operation is performed, a resistance of the memory element 12 may be programmed according to the voltage difference between the word line WL and the bit line BL to store the data to be written in. When the read operation is performed, the resistance of the memory element 12 may be evaluated in order for determining the data stored in the memory element 12.

In some embodiments, the memory element 12 may be a single-level cell (SLC), a multiple-level cell (MLC), a tri-level cell (TLC), a quadra-level cell (QLC) or the like. The memory element 12 may be, for example but not limited to, resistive random-access memory (ReRAM or RRAM), magnetic RAM (MRAM), phase change memory (PCM), flash memory comprising charge storage material or floating gate, or the like. Other types or configurations of memory elements are also within the scopes of various embodiments.

Figure 1C:
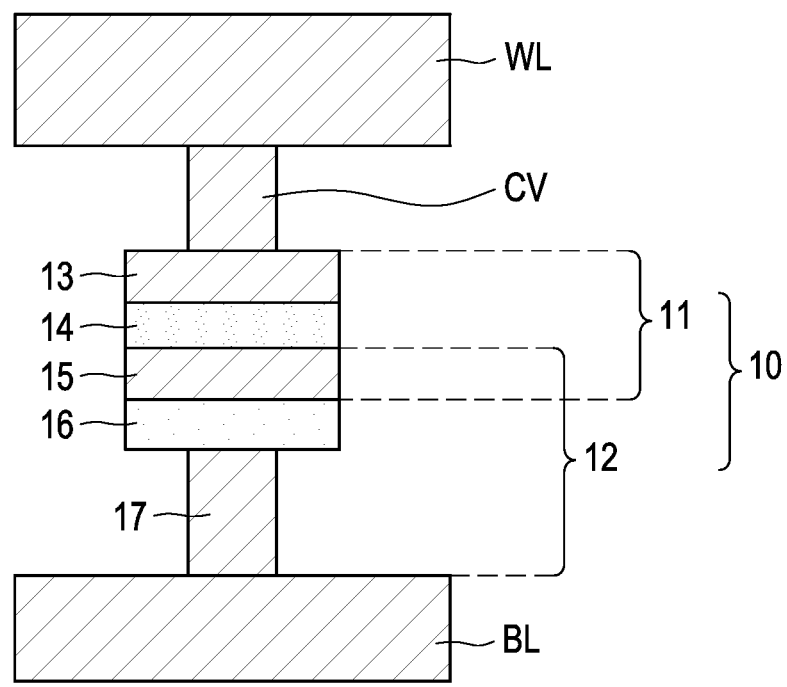
FIG. 1C illustrates a cross-sectional view of the memory device as illustrated in FIG. 1A according to some embodiments of the present disclosure.

FIG. 1C illustrates a cross-sectional view of the memory device 10 as illustrated in FIG. 1A according to some embodiments of the present disclosure. In this embodiment, the memory element 12 is a PCM memory. The memory element 12 may be an SLC, and the resistance of the memory element 12 may be programmed to store data. However, persons skilled in the art may modify or adjust the memory device based on different design concept, and thus other types of memories are also within the scopes of various embodiments.

Referring to FIGS. 1A and 1C, each memory cell 10 may include a selector 11 and a memory element 12. The selector 11 is a two-terminal switching device, and one of the terminals of the selector 11 is shared with the memory element 12. In some embodiments, an electrode 13 is functioned as a top terminal of the selector 11, and may be coupled to the word line WL through a conductive via CV. In addition, an electrode 15 may be functioned as a bottom terminal of the selector 11, and may be shared with the memory element 12. The electrodes 13, 15 are each formed of a conductive material. For example, candidates of the conductive material may include Cu, W, TiN, TaN, Ru, AlN, Co, C, Si, or the like and combinations thereof.

A switching layer 14 may be sandwiched between the electrodes 13, 15. An electrical resistance across the switching layer 14 may be altered during operation. When the switching layer 14 is in a low resistance state, the selector 11 is described as in a conducted state, and the memory element 12 becomes accessible. On the other hand, when the switching layer 14 is in a high resistance state, the selector 11 is described as in a cutoff state, and the memory element 12 is inaccessible. In some embodiments, the selector 11 is an ovonic threshold selector (OTS). In these embodiments, when a voltage bias applied across the switching layer 14 reaches a threshold voltage, a conductive path may be formed in the switching layer 14, and the switching layer 14 is in the low resistance state. On the other hand, when the voltage bias falls below the threshold voltage, the conductive path may be cut off, and the switching layer 14 is in the high resistance state. As an example, the switching layer 14 may include a chalcogenide compound. For instance, the switching layer 14 may include GeTe, GeCTe, AsGeSe, GeSbTe, GeSiAsTe, GeSe, GeSbSe, GeSiAsSe, GeS, GeSbS, GeSiAsS, the like, or combinations thereof.

The memory element 12 may be a two-terminal device as well. As described above, the electrode 15 may be functioned as a common terminal of the selector 11 and the memory element 12. In some embodiments, an electrode 17 is functioned as the other terminal of the memory element 12, and may be coupled to the bit line BL. As similar to the electrodes 13, 15, the electrode 17 is formed of a conductive material as well. As examples, candidates of the conductive material may include Cu, W, TiN, TaN, Ru, AlN, Co, C, Si, or the like and combinations thereof.

A storage layer 16 lies between the two terminals of the memory element 12 (e.g., the electrodes 15, 17). Microstructure in the storage layer 16 may be altered according to input signals applied across the storage layer 16. In corresponding to the microstructure change, the storage layer 16 may be switched between a high resistance state and a low resistance state. Further, the resistance state of the storage layer 16 may be held even when the input signal is removed, and the memory element 12 may be referred as a non-volatile memory device. In some embodiments, the memory element 12 is a phase change non-volatile memory device. In these embodiments, a crystallinity of the storage layer 16 may be increased when the storage layer 16 is turned to the low resistance state. On the other hand, when the storage layer 16 is in the high resistance state, the storage layer 16 may be amorphous or may have a rather low crystallinity. In some embodiments, the storage layer 16 is formed of a chalcogenide compound. The chalcogenide compound may include Ge, Te and Sb. For instance, the chalcogenide material may be GeSbTe, such as $Ge_2Sb_2Te_5$ (GST225), $Ge_4Sb_2Te_4$ (GST424) or so forth).

The signal for programming the storage layer 16 may be provided through the electrode 17. A thermal energy may be generated by the electrode 17 as a result of joule heating effect, and such thermal energy is provided to the storage layer 16 for changing the microstructure in the storage layer 16. In order to enhance the joule heating efficiency, the electrode 17 may be formed with a rather small diameter. In some embodiments, the electrode 17 has a footprint area smaller than a footprint area of each of the storage layer 16, the electrodes 15, 13 and the switching layer 14. In these embodiments, a sidewall of the electrode 17 may be laterally recessed from sidewalls of the storage layer 16, the electrodes 15, 13 and the switching layer 14.

Figure 1D:
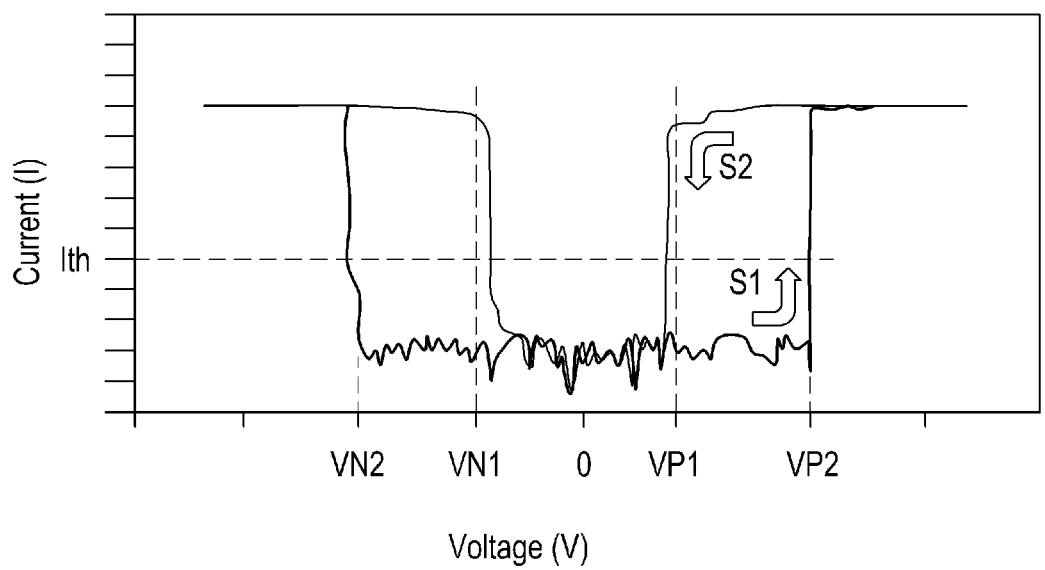
FIG. 1D illustrates relationship curves between voltage to current of the selector as illustrated in FIG. 1A according to some embodiments of the present disclosure.

FIG. 1D illustrates relationship curves between voltage to current of the selector 11 as illustrated in FIG. 1A according to some embodiments of the present disclosure. In some embodiments, the selector 11 may be a hysteresis selector.

It is noted that when the voltage difference between the word line WL and the bit line BL is a positive voltage, a voltage of the word line WL is greater than a voltage of the bit line BL. When the voltage difference between the word line WL and the bit line BL is positive, the selector 11 is operated under a forward biased voltage. On the contrary, when the voltage difference between the word line WL and the bit line BL is negative, a voltage of the word line WL is less than a voltage of the bit line BL. When the voltage difference between the word line WL and the bit line BL is negative, the selector 11 is operated under a reverse biased voltage.

In a first operating scenario when the voltage difference between the word line WL and the bit line BL is a positive voltage, the selector 11 may have hysteresis characteristic. When the voltage difference is changed from less than to be greater than a predetermined voltage threshold VP2, a state of the selector 11 may be changed from cutoff to be conducted (or turned on). Therefore, when the voltage difference is increasing, the current flowing through the selector 11 is changing along a direction 51. That is, the current flowing through the selector 11 is changed from less than to be greater than a predetermined current threshold Ith. In addition, when the voltage difference is changed from greater than to be less than a predetermined voltage threshold VP1, a state of the selector 11 may be changed from conducted to be cutoff. Therefore, when the voltage difference is decreasing, the current flowing through the selector 11 is changing along a direction S2. The current flowing through the selector 11 is changed from greater than to be less than the predetermined current threshold Ith. In addition, the predetermined voltage threshold VP2 for turning on the selector 11 is greater than the voltage threshold VP1 for cutoff the selector 11.

In a second operating scenario when the voltage difference between the word line WL and the bit line BL is negative, the selector 11 may also have hysteresis characteristic. When the voltage difference is changed from greater than to be less than a predetermined voltage threshold VN2, a state of the selector 11 may be changed from cutoff to be conducted (or turned on). The current flowing through the selector 11 is changed from less than to be greater than the predetermined current threshold Ith. In addition, when the voltage difference is changed from less than to be greater than a predetermined voltage threshold VN1, a state of the selector 11 may be changed from conducted to be cutoff. The current flowing through the selector 11 is changed from greater than to be less than the predetermined current threshold Ith. In addition, the predetermined voltage threshold VN2 for turning on the selector 11 is less than the voltage threshold VN1 for cutoff the selector 11.

Therefore, when the voltage difference across the memory device 10 is changing around the predetermined voltage threshold VP2 unstably, the selector 11 will be only turned on by the first time when voltage difference passes the predetermined voltage threshold VP2. After that, the selector 11 will be stably operated under the state of conduction, and thus keeping the current flowing through the selector 11 stable. That is, the selector 11 may keep the current of the memory device 10 stable by the hysteresis characteristic.

Figure 1E:
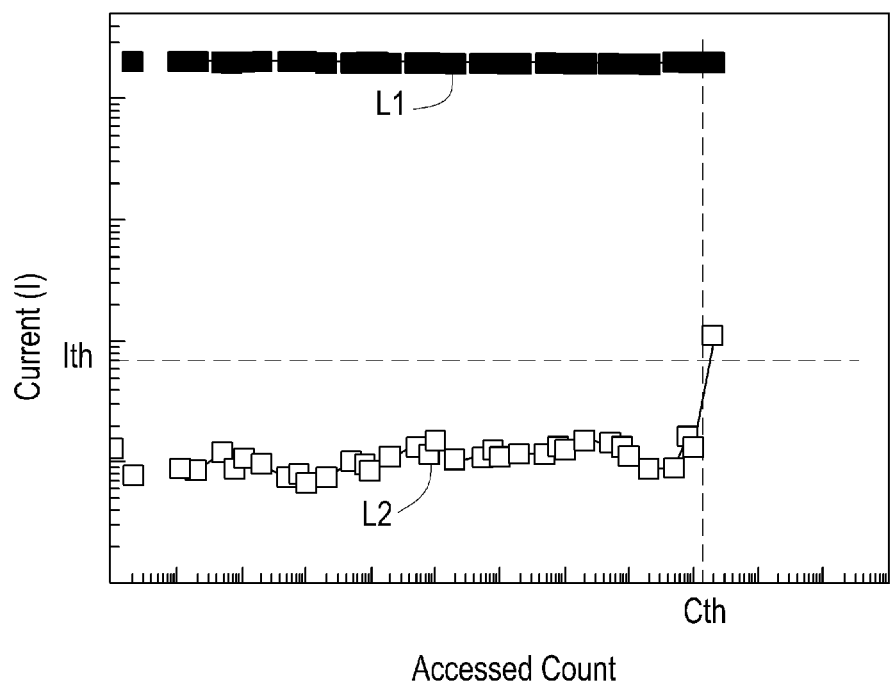
FIG. 1E illustrates relationship curves between current to accessed count of the selector as illustrated in FIG. 1A according to some embodiments of the present disclosure.

FIG. 1E illustrates relationship curves between current to accessed count of the selector 11 as illustrated in FIG. 1A according to some embodiments of the present disclosure. In some embodiments, the accessed count is how many times the selector 11 has been switched between cutoff and conducted. In some embodiments, the current flowing through the selector 11 may be varied according to how many times the selector 11 has been accessed.

In FIG. 1E, curves L1, L2 are illustrated. The curves L1, L2 correspond to how a current of the selector 11 is varied through an accessed count of the selector 11 increases. Specifically, the curve L1 corresponds to a current variation when the selector 11 is conducted. The curve L2 corresponds to a current variation when the selector 11 is cutoff.

As can be seen in FIG. 1E, the conducting current of the selector 11 is kept at about the same level when accessed count of the selector 11 increases. In comparison, the cutoff current of the selector 11 increases rapidly when an accessed count of the selector 11 is changed to be greater than a predetermined count threshold Cth. The cutoff current of the selector 11 is changed from less than to be greater than a predetermined current threshold Ith when the accessed count of the selector 11 is changed to be greater than a predetermined count threshold Cth. In other words, the leakage current may be varied as the accessed count of the selector 11 increases. The increased leakage current may result in additional power consumption.

Figure 2A:
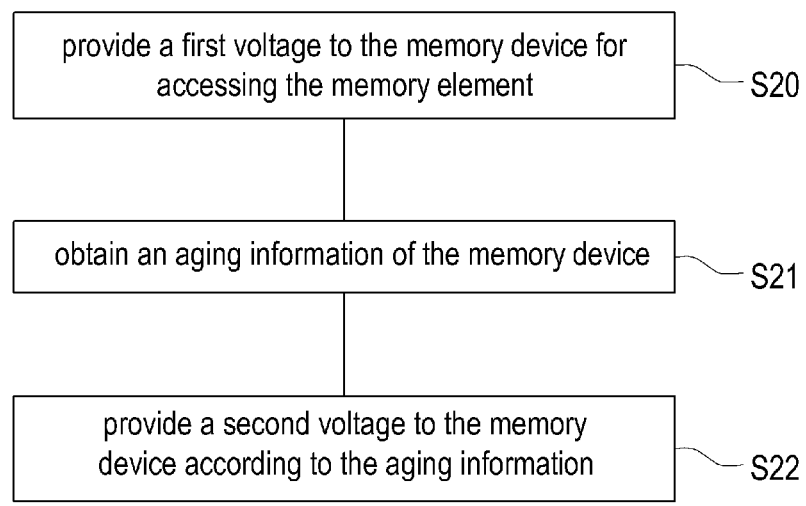
FIG. 2A illustrates an operating method of the memory device as illustrated in FIG. 1A according to some embodiments of the present disclosure.

FIG. 2A illustrates an operating method of the memory device 10 as illustrated in FIG. 1A according to some embodiments of the present disclosure. Referring to FIGS. 1A, 1E, 2, the leakage current of the selector 11 increases when the accessed count of the selector 11 passes the predetermined count threshold Cth. The operating method as illustrated in FIG. 2A may be used to reduce leakage current of the selector 11 as illustrated in FIG. 1A. The method in FIG. 2A includes steps S20-S22.

In Step S20, a first voltage is provided to the memory device 10 for accessing the memory element 12. The first voltage provided to the memory device 10 is for performing a read operation or a write operation to the memory device 10. When the first voltage with a first voltage value is provided to the memory device 10, the selector 11 may be turned on the first voltage. Moreover, the write operation is performed to the memory element 12 and a logic 1 is written to the memory element 12 according to the first voltage value. When the first voltage with a second voltage value is provided to the memory device 10, the selector 11 may be turned on the first voltage. Moreover, the write operation is performed to the memory element 12 and a logic 0 is written to the memory element 12 according to the second voltage value. When the first voltage with a third voltage value is provided to the memory device, the selector 11 may be turned on and the read operation is performed to the memory element 12.

In some embodiments, the memory element 12 is a phase change non-volatile memory. The memory element 12 may be programmed into a high resistance state or a low resistance state to store the data. The first voltage value is greater than the second voltage value, and the second voltage value is greater than the third voltage value.

In step S21, an aging information of the memory device 10 is obtained. Referring to FIG. 1E, the cutoff current of the selector 11 increases as the selector 11 ages. Therefore, the aging information of the memory device 10 may be obtained to evaluate at what level the leakage current of the selector 11 is. The aging information may include at least one of a cutoff current information and an accessed count information. The cutoff current information may be obtained by monitoring a current flowing through the memory device 10 when the selector 11 is cutoff. The accessed count information may be obtained by recording how many times the selector 11 has been switched between cutoff and conducted. As can be seen in FIG. 1E, the cutoff current of the selector 11 is changed to be greater than the predetermined current threshold Ith when the accessed count of the selector 11 passes the predetermined count threshold Cth. Therefore, either one of the predetermined current threshold Ith or the predetermined count threshold Cth may be used for determined the leakage current.

In step S22, a second voltage is provided to the memory device 10 according to the aging information. In some embodiments, the second voltage is provided to the memory device 10 when the cutoff current information of the aging information shows that the cutoff current of the selector 11 is greater than the predetermined current threshold Ith. In some embodiments, the second voltage is provided to the memory device 10 when the accessed information of the aging information shows that the accessed count of the selector 11 is greater than the predetermined count threshold Cth. When at least one of the above criteria is met, it can be determined that the selector 11 meets an aging condition.

In some embodiments, a threshold voltage of the selector 11 is lowered when the aging condition is met. That is, the leakage current or the cutoff current of the selector 11 increases when the selector 11 is biased to be cutoff. The increased leakage current or cutoff current may lead to greater power consumption. In addition, when a reading operation is performed to a selected memory device 10, the selector 11 of the selected memory device 10 is turned on and the current flowing through is utilized for evaluating data stored by the memory element 12. However, a current flowing on the bit line BL or the word line WL exhibits not only the conducted current of the selected memory device 10 but the cutoff currents of other unselected memory devices 10 connected to the same bit line BL or word line WL. As a result, the increased cutoff current may lead to the data obtained from the selected memory device 10 by to be incorrect.

In some embodiments, a recovery operation may be performed to the memory device 10 when it is determined that the selector 11 meets the aging condition. In the recovery operation, the second voltage may be provided to the memory device 10. The second voltage and the first voltage may be reverse biased voltages. A fourth voltage value of the second voltage may be provided to the memory device 10 for performing the recovery operation. In some embodiments, the fourth voltage value may be 0.1-10 times of the third voltage value. A shape of the second voltage may be a triangular wave, a square wave, a sine wave, or the like. A pulse width of the second voltage may be 1 ns to 100 ms. In some embodiments, after the recovery operation is performed to the memory device 10 which the aging condition is determined to be met, the cutoff current of the selector 11 of the memory device 10 is reduced or the threshold voltage of the selector 11 of the memory device 10 may be recovered to a higher voltage level.

In some embodiments, before performing the recovery operation to the memory device 10 which the aging condition is determined to be met, the data stored by the selected memory device 10 may be backed up in another memory device 10. After the recovery operation is accomplished, the data backed up may be written back to the selected memory device 10. Therefore, the recovery operation may maintain data integrity of the memory device 10.

Figure 2B:
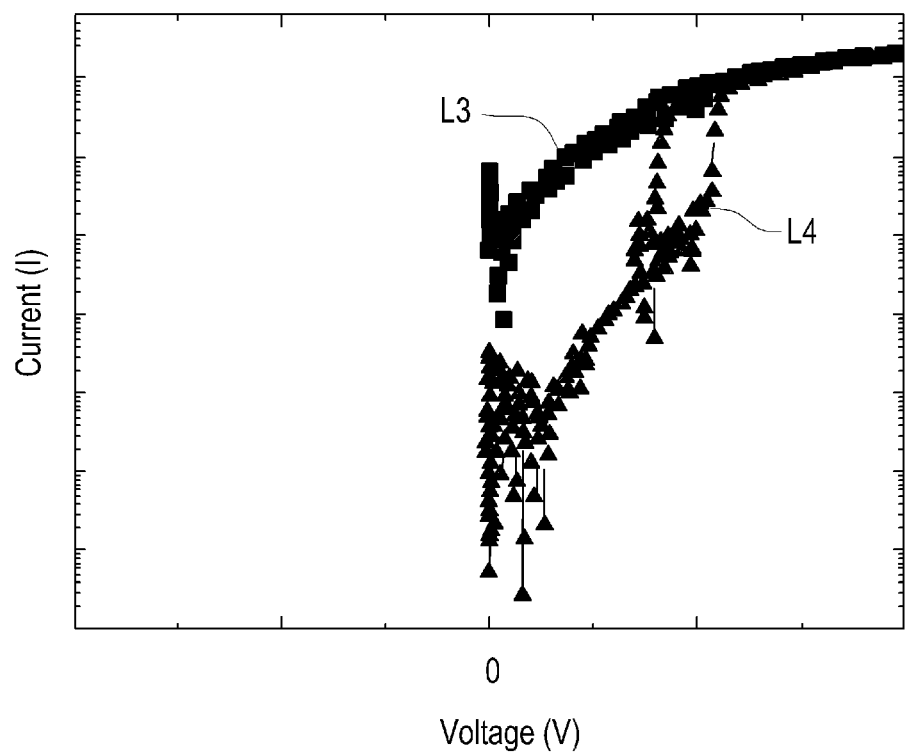
FIG. 2B illustrates relationship curves between voltage to current of a selector as according to some embodiments of the present disclosure.

FIG. 2B illustrates relationship curves between voltage to current of a selector 11 as according to some embodiments of the present disclosure.

Referring to FIG. 2B, curves L3 and L4 are illustrated. In some embodiments, the curve L3 is a relationship curve of a selector which has met the aging condition. In some embodiments, the curve L4 is a relationship curve of a selector to which the recovery operation has been performed. As can be seen in FIG. 2B, the cutoff current level is relatively high, so it becomes hard to tell the difference between the levels of the cutoff current and the conducted current of the selector. Therefore, the increasing cutoff current may lead to greater power consumption and worse data integrity.

However, as can be seen in FIG. 2B, after the recovery operation is performed to the same selector which the aging condition is determined to be met, the level of the cutoff current is recovered to a relatively low level. Therefore, the difference between the levels of the cutoff current and the conducted current of the selector is significant. Therefore, the cutoff current of the selector 11 of the memory device 10 is reduced or the threshold voltage of the selector 11 of the memory device 10 may be recovered to a higher voltage level after the recovery operation is performed.

Figure 3A:
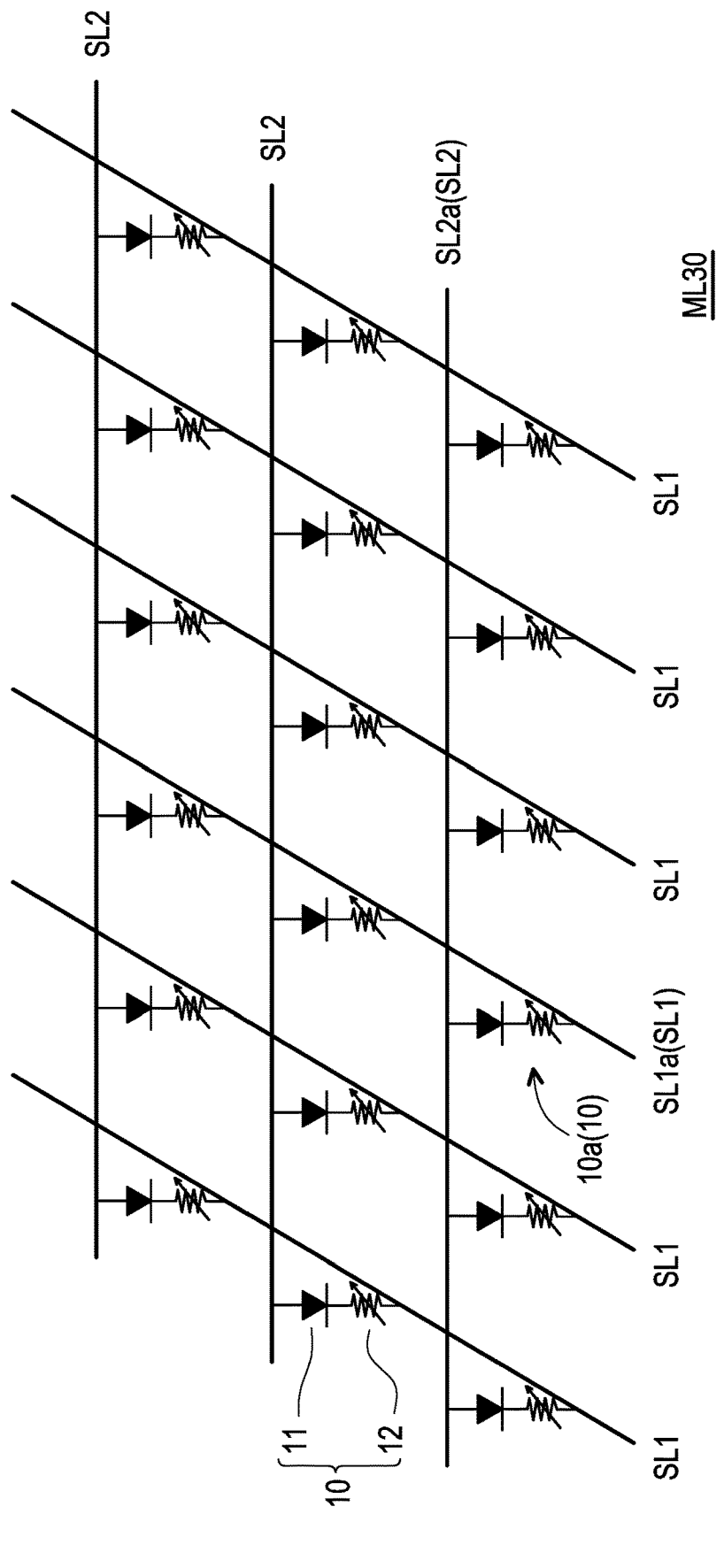
FIG. 3A illustrates a schematic diagram of a memory layer according to some embodiments of the present disclosure.

FIG. 3A illustrates a schematic diagram of a memory layer ML30 according to some embodiments of the present disclosure. The memory layer ML30 includes a plurality of memory devices 10 as illustrated in FIGS. 1A and 1B.

In FIG. 3A, a plurality of signal lines SL1 are disposed along a y-axis direction, and a plurality of signal lines SL are disposed along an x-axis direction. A memory device 10 is connected between each of the signal lines SL1 and each of the signal lines SL2. Each of the memory devices is turned on or cutoff according to the voltages provided to the signal lines SL1 and SL2. The signal lines SL1 may be referred as the bit line BL as illustrated in FIG. 1, and the signal lines SL2 may be referred as the word line WL as illustrated in FIG. 1.

In some embodiments, a selected memory device 10a is accessed according to a voltage difference applied across the selected memory device 10a. Specifically, the selected memory device 10a is connected between a signal line SL1a and a signal line SL2a. The signal line SL1a is provided with a reference voltage VBL and the signal line SL2a is provided with a reference voltage VWL. When the voltage difference between the reference voltages VWL, VBL is the first voltage, the selector 11 of the selected memory device 10 may be turned on, and a read operation or a write operation may be performed to the selected memory device 10a.

In some embodiments, when the selected memory device 10a is being accessed, the provided first voltage is a forward biased voltage with the reference voltage VWL to be greater than the reference voltage VBL. In some embodiments, when the write operation is performed to the selected memory device 10a, a resistance of the memory element 12 of the selected memory device 10a may be programmed into a high resistance state or a low resistance state according to the voltage difference provided. When the read operation is performed to the selected memory device 10a, a level of the current flowing through the selected memory device 10a may be utilized for determining whether the memory element 12 of the memory device 10a is in a high resistance state or a low resistance state. Since the level of the current flowing through the selected memory device 10 corresponds to the data stored by the memory device 10a, the data stored by the memory element 12 may be readout by evaluating the level of the current on the signal lines SL1 and/or SL2.

In some embodiments, when the voltage difference between the reference voltages VWL and VBL is the first voltage with the first voltage value, the write operation may be performed to the memory device 10a in order to write logic 1 to the memory device 10a. When the voltage difference between the reference voltages VWL and VBL is the first voltage with the second voltage value, the write operation may be performed to the memory device 10a in order to write logic 0 to the memory device 10a. When the voltage difference between the reference voltages VWL and VBL is the first voltage with the third voltage value, the read operation may be performed to the memory device 10a in order to readout the data stored by the memory device 10a.

In addition, when the selected memory device 10a is being accessed, selectors 10 of other unselected memory devices 10 may be cutoff, so data read from the selected memory device 10a or data stored by other unselected memory devices will not be affected. In some embodiments, the signal lines SL1 and SL2 may be provided with half of the third voltage value. Therefore, the unselected memory devices 10 connected between the signal lines SL1 and SL2 may receive the voltage difference of zero, which is insufficient for their selectors 11 to be turned on. On the other hand, the unselected memory devices 10 connected between the signal lines SL1 and SL2a or connected between SL1a and SL2 may receive the voltage difference of half of the third voltage value which is also insufficient for their selectors 11 to be turned on. Therefore, only the selected memory device 10a is turned on and accessing the selected memory device 10a will not affect the data integrity.

In some embodiments, when the selector 11 of the memory device 10a is determined that the aging condition is met according to the aging information obtained, the recovery operation may be performed to the memory device 10a. When the voltage difference between the provided reference voltages VWL and VBL is the second voltage, the recovery operation is performed to the selected memory device 10a. In some embodiments, the second voltage is reverse biased voltage, which means the reference voltage VWL is less than the reference voltage WBL. Therefore, the first voltage and the second voltage are reverse biased voltages. In some embodiments, the fourth voltage value may be 0.1-10 times of the third voltage value. In some embodiments, after the recovery operation is performed to the selected memory device 10a which the aging condition is determined to be met, the cutoff current of the selector 11 of the selected memory device 10 is reduced or the threshold voltage of the selector 11 of the selected memory device 10 may be recovered to a higher voltage level.

Figure 3B:
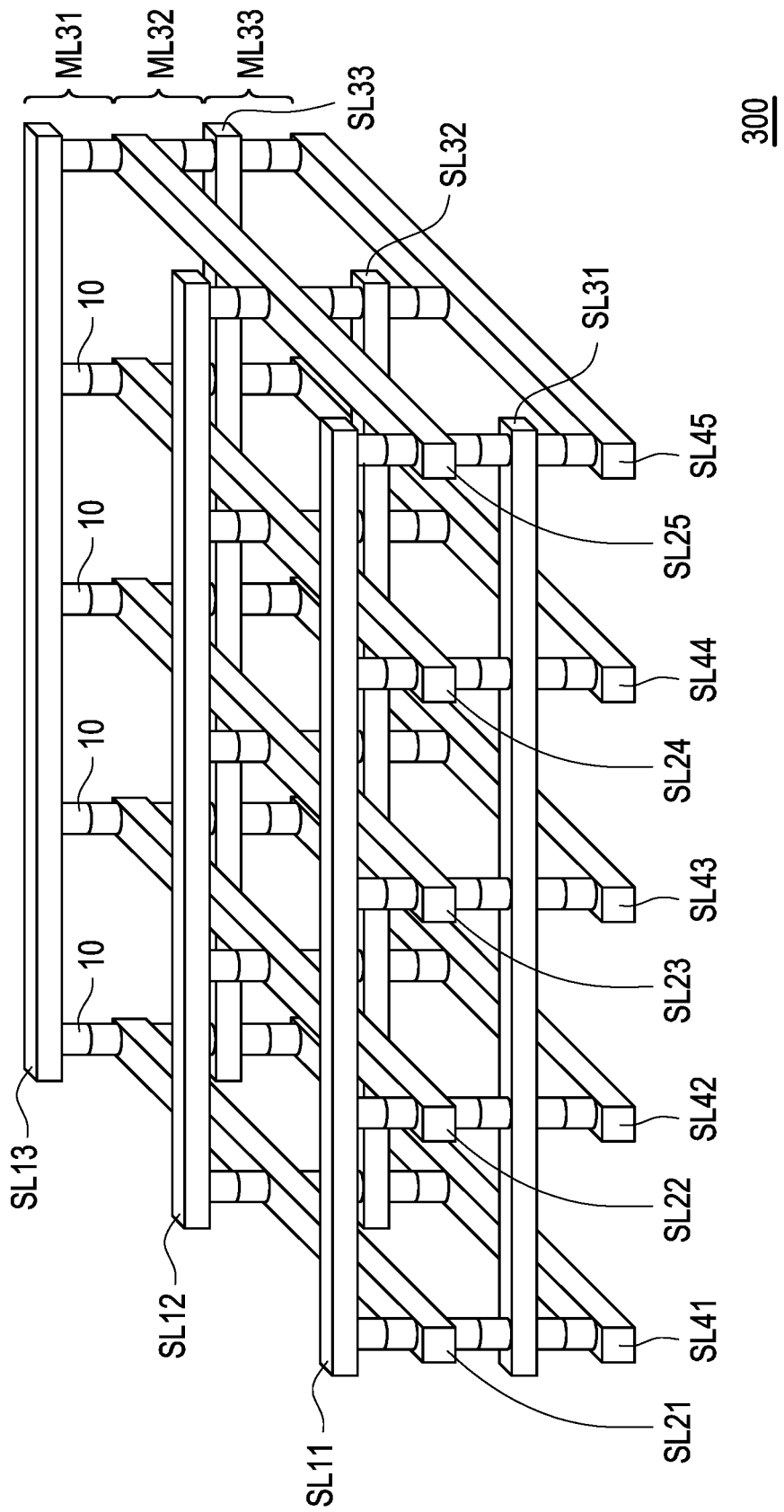
FIG. 3B illustrates a three-dimensional view illustrating a memory array according to some embodiments of the present disclosure.

FIG. 3B illustrates a three-dimensional view illustrating a memory array 300 according to some embodiments of the present disclosure.

The memory array 300 as illustrated in FIG. 3B includes signal lines SL11-SL13, SL21-SL23, SL31-SL33, SL41-SL43 and a plurality of memory devices 10 as illustrated in FIG. 1A. The signal lines SL11-SL13, SL31-SL33 extends along an x-axis direction, and the signal lines extends along a y-axis direction. The signal lines SL11-SL13 are disposed at a first horizontal level. The signal lines SL21-SL23 are disposed at a second horizontal level. The signal lines SL31-SL33 are disposed at a third horizontal level. The signal lines SL41-SL43 are disposed at a fourth horizontal level. The signal lines SL11-SL13, SL21-SL23 and the memory devices 10 connected there between form a memory layer ML31. The signal lines SL21-SL23, SL31-SL33 and the memory devices 10 connected there between form a memory layer ML32. The signal lines SL31-SL33, SL41-SL43 and the memory devices 10 connected there between form a memory layer ML33. Therefore, adjacent memory layers share the signal lines of a same horizontal level. The memory layer ML31-ML33 are stacked along a z-axis direction. Each memory layers are disposed at different horizontal levels. In some embodiments, operations of a selected memory device 10 in the memory array 300 may be similar to the selection schemes as described with reference to FIG. 3A. When a memory device 10 is selected, the signal lines coupled to the selected memory cell 100 may receive a first voltage.

As being deployed along the vertical direction, the memory array 300 is no longer limited to two-dimensional design, and storage density can be significantly increased without increasing a footprint area of the memory array 300. Each horizontal level of the memory array 300 may be defined by a layer of the memory cells 100 and the layers of the first and second signal lines SL1, SL2 connected thereto. Although the memory array 10a is depicted as having four horizontal levels, those skilled in the art may adjust an amount of the horizontal levels of the memory array 10a. For instance, the memory cell 10a may have two to ten horizontal levels. However, it should be understood that different numbers of signal lines, memory devices, and memory layers are within the scope of various embodiments.

Figure 3C:
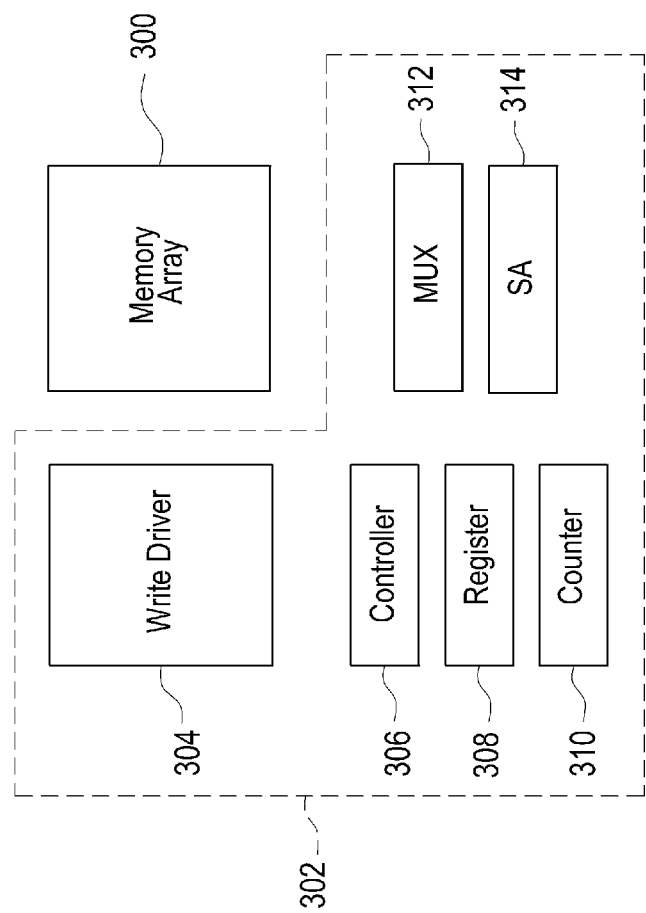
FIG. 3C illustrates schematic block diagram of a memory system according to some embodiments of the present disclosure.

FIG. 3C illustrates schematic block diagram of a memory system 3 according to some embodiments of the present disclosure. The memory system includes a memory array 300 and a memory controller 302. The memory array 300 may be implemented by the array 300

The memory system 3 comprises a memory array 300 and a control circuit (also referred as a controller) 302 coupled to the memory array 300. The control circuit 302 is configured to control operations of the memory array 300. The control circuit 302 is configured to perform at least one of a write operation (or a program operation) or a read operation or a recovery operation to the memory array 300.

The control circuit 302 includes a driver 304, a controller 306, a register 308, a counter 310, a multiplexer (MUX) 312, and a sense amplifier (SA) 314. In at least one embodiment, the control circuit 302 further includes one or more clock generators for providing clock signals for various components of the memory system 1, one or more input/output (I/O) circuits for data exchange with external devices, and/or one or more controllers for controlling various operations in the memory system 1.

In some embodiments, the driver 304 is coupled to the signal lines of the memory array 300. The controller 306 controls the driver 304 for providing proper voltages to the signal lines in order to perform at least a program operation or a read operation or a recovery operation to a selected memory device of the memory array 300.

The register 308 is coupled to the controller 306. The register 308 may store configuration data of the memory array 300. For example, the register 308 may store configuration data such as write current and/or read voltage and/or verify threshold voltage, or the like, which is used for programming electrical characteristics of the memory array 300. In some embodiments, the register 308 stores the configuration data of the second voltage applied to the memory for performing the recovery operation. For example, the register 308 stores the voltage magnitude and the pulse width of the second voltage.

The counter 310 is coupled to the controller 306. The counter 310 is configured to collect accessed count of the memory devices in the memory array 300. The counter 310 provides the accessed count information to the controller 310, so the controller 310 may use the accessed count information to determine whether an aging condition of a memory device is met.

The MUX 312 is coupled to the memory devices of memory array 300 through signal lines to perform the read operation to at least one memory device of the memory array 300, and the MUX 312 is coupled to the SA 314 through MUX 312. In some embodiments, the MUX 312 selects the signal lines corresponding to the selected memory device selected by the driver 304 for reading.

The SA 314 is coupled to the MUX 312. The SA 314 is configured to receive electrical signals, e.g. voltage or current signals, of the selected memory device through selection of the MUX 312 to read data stored in the selected memory device.

The controller 306 is coupled to the driver 304, the register 308, the MUX 312 and the SA 314. The controller 306 is configured to access configuration data stored in the register 308 for controlling the driver 304, the MUX 312 and the SA to perform at least one of the write operation and the read operation to the memory devices in the memory array 300. Example controller 306 include, but are not limited to, a central processing unit, a microprocessor, an application specific integrated circuit, a graphics processing unit, a field programmable gate array, an advanced RISC machine or combinations thereof. In addition, the controller 306 may also be implemented through synthesis using hardware description language (HDL), such as high-speed hardware description language (VHDL), Verilog or the like.

In a write operation for programming logic 1, a first voltage with a first voltage value may be provided to a selected memory device through corresponding signal lines. In a write operation for programming logic 0, a first voltage with a second voltage value may be provided to a selected memory device through corresponding signal lines. Therefore, sufficiently large voltage difference is provided to the selected memory device for performing the write operation. For those unselected memory devices, the voltage provided to the signal lines would be insufficient for their selectors to be turned on, so the write operation may not affect the data stored by the unselected memory devices.

In a read operation, the first voltage with the third voltage value is provided to the selected memory device through the signal lines signal lines by the write driver 304. The MUX 312 is configured to select the signal line corresponding to the selected memory device for reading. The SA 314 is configured to sense current flowing through the selected memory device and retrieved the data stored by the selected memory device. In some embodiments, the driver 304, the MUX 312 and the SA 314 may be controller by the controller 306 to sense a cutoff current information of the memory array 300. For example, the MUX 312 may provide voltages to the signal lines to cutoff a selected memory device, or cutoff memory devices connected to a selected signal line, or cutoff memory devices of a selected memory layer. The SA 314 may receive the cutoff current of the selected memory device, or the cutoff current of the selected signal line, or the cutoff current of the selected memory layer. The SA 314 may provide the cutoff current information to the controller 306, so the controller 306 may use the cutoff current information to determine whether an aging condition is met.

In some embodiments, the memory system 1 is configured for performing a computing-in-memory (CiM) operation. The control circuit 302 is configured for writing weight values to the memory array 300 according to error tolerance of each bit of the weight value. Although it is not illustrated in FIG. 1, the control circuit 302 further includes a computing-in-memory (CiM) circuit, coupled to the SA 314. The CiM circuit is configured to perform one or more mathematical and/or logical operations based on the data read from the one or more memory device and also based on one or more control signals. The one or more control signals is/are received from other internal control circuitry (not shown) in the control circuit 302 and/or from external control circuitry. In some embodiments, the control circuit 302 may further to coordinate one or more mathematical and/or logical operations performed by the CiM circuit with one or more read operations and/or one or more write operations as described herein, to perform one or more computing-in-memory operations. In at least one embodiment, CiM operations are advantageous over other approaches, where data are moved back and forth between the memory and a processor, because such back-and-forth data movement which is a bottleneck to both performance and energy efficiency is avoidable. Examples of CiM applications include, but are not limited to, artificial intelligence, image recognition, neural network for machine learning, or the like. In some embodiments, the CiM circuit is omitted and the memory system 1 is configured for data storage. The described memory system 1 configuration is an example, and other memory device configurations are within the scopes of various embodiments.

In some embodiments, the recovery operation described in above paragraphs related to step S22 of FIG. 2A may be performed to more than one memory devices. For example, the recovery operation may be performed to the memory devices 10 connected to a signal line, or the memory device of a memory layer. The control circuit 302 may control the driver 304 for providing the second voltage to the at least one selected memory device through the selected signal lines.

In some embodiments, the control circuit 302 may be configured to verify levels of the cutoff current of the at least one selected memory device 10. Specifically, the control circuit 302 may obtain the cutoff current information of the at least one selected memory device 10 to determine whether the cutoff current of the at least one selected memory device 10 is less than the predetermined current threshold as described in FIG. 1D. In some embodiments, when it is determined that the cutoff current of the at least one selected memory device 10 is still greater than the predetermined current threshold, the control circuit 302 may increase magnitude of the second voltage and repeat the recovery operation based on the increased second voltage. The aforementioned procures may be repeated until the cutoff current of the at least one selected memory device 10 is less than the predetermined current threshold.

Figure 4:
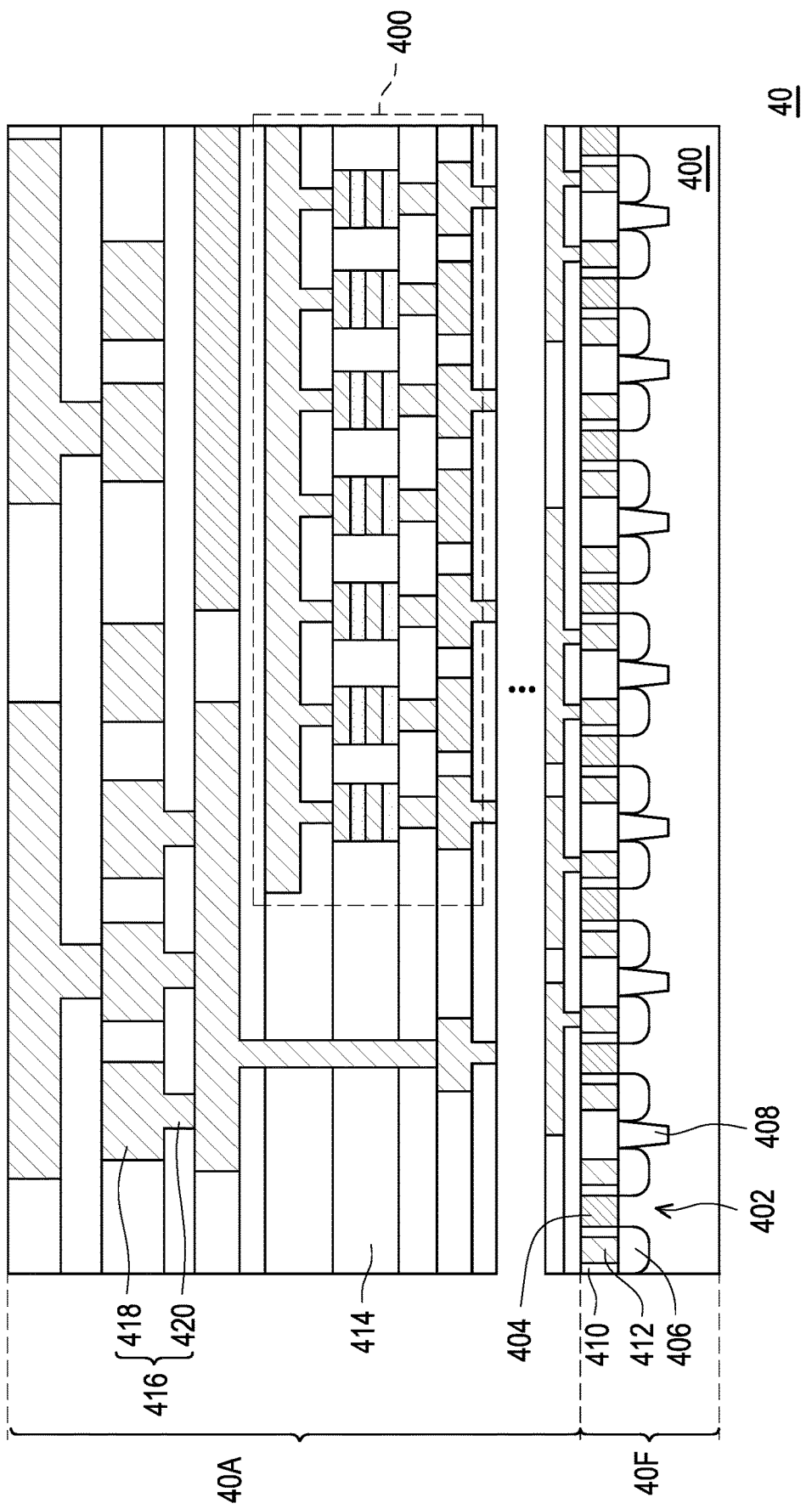
FIG. 4 illustrates a schematic cross-sectional view of a semiconductor chip according to some embodiments of the present disclosure.

FIG. 4 illustrates a schematic cross-sectional view of a semiconductor chip 40 according to some embodiments of the present disclosure.

Referring to FIG. 3C, the semiconductor chip 40 may have a front-end-of-line (FEOL) structure 40F built on a semiconductor substrate 400. The FEOL structure 40F may include transistors 402. Each of the transistors 402 may include a gate structure 404 and a pair of source/drain structures 406 at opposite sides of the gate structure 404. Further, adjacent transistors 402 may be isolated from one another by an isolation structure 408 formed in the semiconductor substrate 400. In some embodiments, the transistors 402 are planar type transistors. In these embodiments, the gate structures 404 are formed on planar portions of the semiconductor substrate 400, and the source/drain structures 406 may be formed in the semiconductor substrate 400. In alternative embodiments, the transistors 402 are fin type transistors or gate-all-around (GAA) transistors. In these alternative embodiments, the semiconductor substrate 400 may be shaped to form fin structures at its top surface, or stacks of channel structures (e.g., stacks of semiconductor nanosheets) may be formed on the semiconductor substrate 400. Each fin structure/channel structure may extend between a pair of the source/drain structures 406. In addition, the gate structures 404 may intersect and cover the fine structures or the stacks of channel structures. Moreover, the FEOL structure 40F may further include a dielectric layer 410 and contact structures 412 formed in the dielectric layer 410. The contact structures 412 penetrate through the dielectric layer 410, to establish electrical contact with the source/drain structures 406.

The memory array 400 is embedded in a back-end-of-line (BEOL) structure 40B formed on the FEOL structure 40F. The BEOL structure 40B may include a stack of interlayer dielectric layers 414. For conciseness, only one of the interlayer dielectric layers 414 is labeled. The memory array 10 is formed in successive ones of the interlayer dielectric layers 414. Further, the BEOL structure 40B also includes conductive elements 416 spreading in the stack of interlayer dielectric layers 414, for interconnecting the transistors 402, and for out-routing the memory array 10. The conductive elements 416 may be distributed below, around and over the memory array 10, and may include conductive patterns 418 and conductive vias 620. Each conductive pattern 418 laterally extends in one of the interlayer dielectric layers 414. In addition, each conductive via 620 vertically extends through one or more of the interlayer dielectric layers 414 to establish electrical contact with one or more of the conductive patterns 418, or to establish electrical contact with one of the signal lines in the memory array 10 (i.e., one of the first signal lines SL1 or one of the second signal lines SL2). The memory array 10 may be routed to some of the transistors 402 in the FEOL structure 40F through some of the conductive elements 416, and can be driven by a driving circuit including these transistors 402.

Although the conductive elements 416 below the memory array 10 are depicted as being connected to the conductive elements 416 above the memory array 10 through a long conductive via 620 penetrating through multiple interlayer dielectric layers 414, such long conductive via 620 may be alternatively replaced by a combination of short conductive vias 620 and some conductive patterns 418. The present disclosure is not limited to the arrangement of the conductive elements 416. Further, although not shown, passivation layer(s) and electrical connectors as chip inputs/outputs (I/Os) may be formed on the BEOL structure 40B.

In accordance with an embodiment, a control method to operate a memory device, the memory device comprising a selector and a serially connected memory element, the method comprising: providing a first voltage to the memory device for accessing the memory element; obtaining an aging information of the memory device; and providing a second voltage to the memory device according to the aging information, wherein the first voltage and the second voltage are reverse biased voltages.

In accordance with an embodiment, a memory system, comprises a memory array and a control circuit. The memory array comprises a plurality of memory devices, wherein each of the memory devices comprises a selector and a serially connected memory element. The control circuit is coupled to the memory array, wherein the control circuit is configured to perform: providing a first voltage to the plurality of memory devices for accessing the memory elements of the memory devices; obtaining an aging information of the memory devices; and providing a second voltage to a selected memory device according to the aging information, wherein the first voltage and the second voltage are reverse biased voltages.

In accordance with an embodiment, a control method of controlling a memory system is provided. The memory system comprises a memory array and a control circuit, the memory array comprises a plurality of memory devices, and each of the memory devices comprises a selector and a serially coupled memory element. The control method comprises: providing, by the control circuit, a first voltage to the memory array for accessing the memory element; obtaining, by the control circuit, an aging information of the memory array; and providing, by the control circuit, a second voltage to a selected memory device according to the aging information, wherein the first voltage and the second voltage are reverse biased voltages.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A control method to operate a memory device, the memory device comprising a selector and a serially connected memory element, the method comprising:
   providing a first voltage to the memory device for accessing the memory element;
   obtaining an aging information of the memory device, wherein the aging information corresponds to whether a threshold voltage of the selector is lowered; and
   providing a second voltage to the memory device according to the aging information,
   wherein the first voltage is a positive voltage and the second voltage is a negative voltage, and the first voltage and the second voltage are reverse biased voltages,
   wherein when a read operation is performed to the memory device, the first voltage with a first voltage value is applied to the memory device,
   wherein when a recovery operation is performed to the memory device, the second voltage with a second voltage value is applied to the memory device,
   wherein the second voltage value is 0.1-10 times of the first voltage value.

2. The control method of claim 1, wherein the aging information comprises at least one of a cutoff current information and an accessed count information.

3. The control method of claim 2, wherein the step of providing the second voltage to the memory device according to the aging information comprises:
   providing the second voltage to the memory device when it is determined that a cutoff current of the memory device is greater than a predetermined current threshold or an accessed count of the memory device is greater than a predetermined count threshold according to the aging information.

4. The control method of claim 1, wherein the memory element is a phase change non-volatile memory (PCM).

5. The control method of claim 1, wherein a cutoff current of the selector is less than or equal to a predetermined current threshold after the second voltage is applied to the memory device.

6. The control method of claim 1, wherein a pulse width of the second voltage is between 1ns to 100 ms.

7. A memory system, comprising:
a memory array, comprising a plurality of memory devices, wherein each of the memory devices comprises a selector and a serially connected memory element; and
a control circuit, coupled to the memory array, wherein the control circuit is configured to perform:
providing a first voltage to the plurality of memory devices for accessing the memory elements of the memory devices;
obtaining an aging information of the memory devices, wherein the aging information corresponds to whether a threshold voltage of the selector is lowered; and
providing a second voltage to a selected memory device according to the aging information,
wherein the first voltage is a positive voltage and the second voltage is a negative voltage, and the first voltage and the second voltage are reverse biased voltages,
wherein when a read operation is performed to the memory array by the control circuit, the first voltage with a first voltage value is provided to the memory array,
wherein when a recovery operation is performed to the selected memory device by the control circuit, the second voltage with a second voltage value is provided to the selected memory device,
wherein the second voltage value is 0.1-10 times of the first voltage value.

8. The memory system of claim 7, wherein the aging information comprises at least one of a cutoff current information and an accessed count information.

9. The memory system of claim 8, wherein the control circuit is configured to perform:
providing the second voltage to the selected memory device when it is determined that a cutoff current of the selected memory device is greater than a predetermined current threshold or an accessed count of the selected memory device is greater than a predetermined count threshold according to the aging information.

10. The memory system of claim 7, wherein the memory element of each of the plurality of memory devices is a phase change non-volatile memory (PCM).

11. The memory system of claim 7, wherein a cutoff current of the selector of the selected memory device is less than or equal to a predetermined current threshold after the second voltage is applied to the selected memory device.

12. The memory system of claim 7, wherein the memory array is manufactured by a back-end-of-line (BEOL) process.

13. The memory system of claim 7, wherein the recovery operation further includes verifying whether the cutoff current of the selector of the selected memory device is less than the predetermined current threshold, and
when the cutoff current of the selector of the selected memory device is determined to be greater than the predetermined current threshold, the control circuit increases magnitude of the second voltage and provide the increased second voltage to the selected memory device.

14. The memory system of claim 7, wherein a pulse width of the second voltage is between 1ns to 100 ms.

15. A control method of a memory system, comprising a memory array and a control circuit, the memory array comprising a plurality of memory devices, and each of the memory devices comprising a selector and a serially coupled memory element, the control method comprising:
providing, by the control circuit, a first voltage to the memory array for accessing the memory element;
obtaining, by the control circuit, an aging information of the memory array, wherein the aging information corresponds to whether a threshold voltage of the selector is lowered; and
providing, by the control circuit, a second voltage to a selected memory device according to the aging information,
wherein the first voltage is a positive voltage and the second voltage is a negative voltage, and the first voltage and the second voltage are reverse biased voltages,
wherein when a read operation is performed to the memory array by the control circuit, the first voltage with a first voltage value is provided to the memory array,
wherein when a recovery operation is performed to the selected memory device by the control circuit, the second voltage with a second voltage value is provided to the selected memory device,
wherein the second voltage value is 0.1-10 times of the first voltage value.

16. The control method of claim 15, wherein the aging information comprises at least one of a cutoff current information and an accessed count information.

17. The control method of claim 16, wherein the control circuit is configured to perform:
providing the second voltage to the selected memory device when it is determined that a cutoff current of the selected memory device is greater than a predetermined current threshold or an accessed count of the selected memory device is greater than a predetermined count threshold according to the aging information.

18. The control method of claim 15, wherein the memory element of each of the plurality of memory devices is a phase change non-volatile memory (PCM).

19. The control method of claim 15, wherein a cutoff current of the selector of the selected memory device is less than or equal to a predetermined current threshold after the second voltage is applied to the selected memory device.

20. The control method of claim 15, wherein a pulse width of the second voltage is between 1ns to 100 ms.

* * * * *